US012701798B2

(12) United States Patent
Gu et al.

(10) Patent No.: US 12,701,798 B2
(45) Date of Patent: Aug. 4, 2026

(54) SEMICONDUCTOR DEVICE AND METHOD OF FABRICATING THE SAME

(71) Applicant: WUHAN XINXIN SEMICONDUCTOR MANUFACTURING CO., LTD., Wuhan (CN)

(72) Inventors: Liliang Gu, Wuhan (CN); Fan Yang, Wuhan (CN); Sheng Hu, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 581 days.

(21) Appl. No.: 18/087,254

(22) Filed: Dec. 22, 2022

(65) Prior Publication Data

US 2023/0253439 A1 Aug. 10, 2023

(30) Foreign Application Priority Data

Feb. 10, 2022 (CN) .......................... 202210126177.0

(51) Int. Cl.
*H10W 46/00* (2026.01)
*H10F 39/00* (2025.01)

(52) U.S. Cl.
CPC ......... *H10F 39/026* (2025.01); *H10F 39/024* (2025.01); *H10F 39/805* (2025.01); *H10W 46/00* (2026.01); *H10W 46/201* (2026.01)

(58) Field of Classification Search
CPC ......... H01L 23/544; H01L 2223/54493; H01L 2223/54426; H10W 46/00; H10W 46/201
See application file for complete search history.

(56) References Cited

U.S. PATENT DOCUMENTS 6,511,885 B2 * 1/2003 Harada ................ H10D 30/664
257/E29.066
6,533,391 B1 * 3/2003 Pan ....................... H10W 46/00
257/E29.022

(Continued)

FOREIGN PATENT DOCUMENTS

CN 102931084 A 2/2013
CN 202977424 U 6/2013
(Continued)

*Primary Examiner* — Mounir S Amer
*Assistant Examiner* — Alexander Belousov
(74) *Attorney, Agent, or Firm* — MUNCY, GEISSLER, OLDS & LOWE, P.C.

(57) ABSTRACT

A semiconductor device and a method of fabricating the same are disclosed. A reference direction for a substrate is parallel to a first or second crystallographic direction, and a patterned hard mask layer is distributed along the first crystallographic direction. For substrates with notches oriented in different crystallographic directions, the patterned mask layer may be used as a mask for forming trenches in the substrate surface. When viewed normal to a cross-section perpendicular to the substrate, each trench has a cross-sectional width decreasing from the substrate surface toward the inside of the substrate. This allows the semiconductor device to have increased light absorption and conversion efficiency. Forming the trenches by wet etching can avoid increased dark current due to damage to the trenches' side surfaces that may be caused by the use of a dry etching process. Thus, an effective improvement in terms of dark current can be achieved.

9 Claims, 8 Drawing Sheets

(56)     References Cited

U.S. PATENT DOCUMENTS

| | | | | |
|---|---|---|---|---|
| 9,240,464 B2 * | 1/2016 | Eguchi | ................ | H01L 21/3081 |
| 9,589,810 B2 * | 3/2017 | Eguchi | ................... | H10D 30/65 |
| 2001/0023959 A1 * | 9/2001 | Harada | ................ | H10D 30/668 |
| | | | | 257/E29.066 |
| 2003/0094674 A1 * | 5/2003 | Ipposhi | ............. | H01L 21/76254 |
| | | | | 257/E23.179 |
| 2010/0282165 A1 * | 11/2010 | Knechtel | ............... | H10W 46/00 |
| | | | | 118/721 |
| 2016/0079079 A1 * | 3/2016 | Eguchi | ................... | H10D 30/66 |
| | | | | 438/416 |
| 2023/0253439 A1 * | 8/2023 | Gu | ........................ | H01L 23/544 |
| | | | | 257/466 |
| 2024/0395903 A1 * | 11/2024 | Lu | ........................ | H10D 62/121 |

FOREIGN PATENT DOCUMENTS

| | | | |
|---|---|---|---|
| CN | 108987473 A | 12/2018 | |
| CN | 111564370 A | 8/2020 | |
| CN | 111725338 A | 9/2020 | |
| WO | WO2016202899 A1 | 12/2016 | |

* cited by examiner

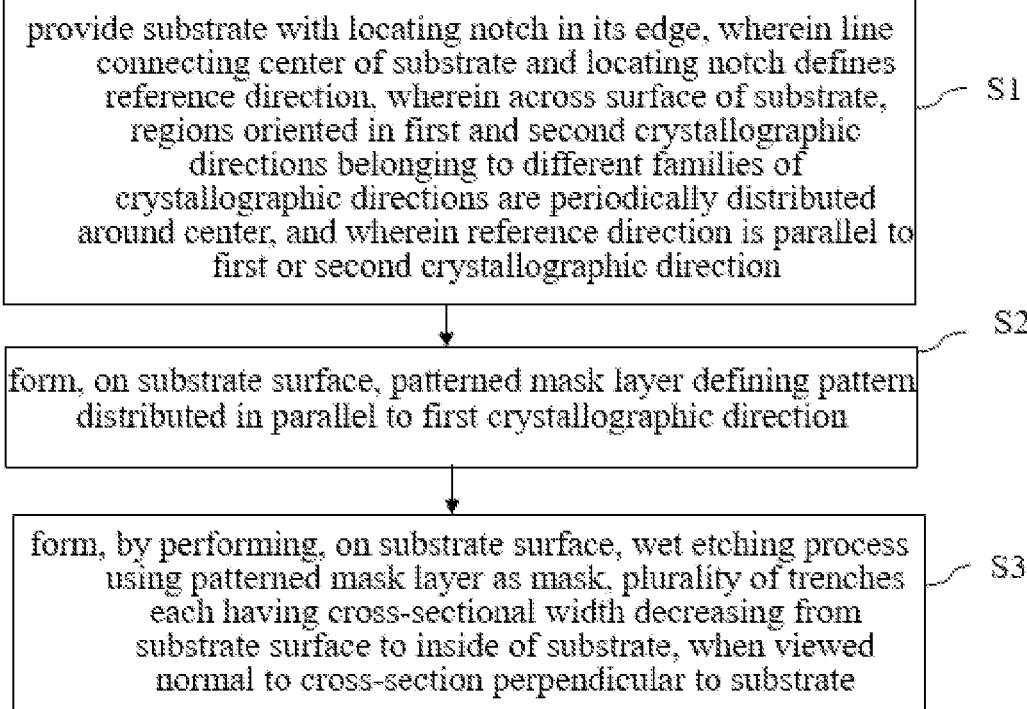

provide substrate with locating notch in its edge, wherein line connecting center of substrate and locating notch defines reference direction, wherein across surface of substrate, regions oriented in first and second crystallographic directions belonging to different families of crystallographic directions are periodically distributed around center, and wherein reference direction is parallel to first or second crystallographic direction    S1 form, on substrate surface, patterned mask layer defining pattern distributed in parallel to first crystallographic direction    S2 form, by performing, on substrate surface, wet etching process using patterned mask layer as mask, plurality of trenches each having cross-sectional width decreasing from substrate surface to inside of substrate, when viewed normal to cross-section perpendicular to substrate    S3

Fig. 1

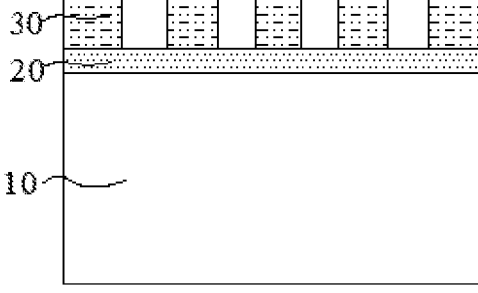

Fig. 2

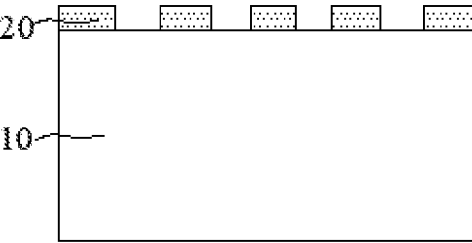

Fig. 3

Crystallographic
Planes

Crystallographic
Directions

SEMICONDUCTOR DEVICE AND METHOD OF FABRICATING THE SAME

CROSS-REFERENCES TO RELATED APPLICATION

This application claims the priority of Chinese patent application number 202210126177.0, filed on Feb. 10, 2022, the entire contents of which are incorporated herein by reference.

TECHNICAL FIELD

The present invention relates to the field of integrated circuit fabrication technology and, in particular, to a semiconductor device and a method of fabricating the semiconductor device.

BACKGROUND

For silicon-based semiconductor devices (e.g., optoelectronic devices), surface reflectivity of silicon is too high. Reflectivity of a non-treated silicon surface to visible light may be as high as 40% or higher, and its reflectivity to near-infrared light may be as high as 60% or higher. Due to such high reflectivity of crystalline silicon to light, optoelectronic devices fabricated from crystalline silicon are suboptimal in terms of quantum efficiency, which ultimately severely limits the application of these optoelectronic products and their performance during use.

Optoelectronic chips operate based on the absorption of light by their materials. However, a material absorbs light in a conditional way-only when energy of the light is greater than the band gap of the material, can the light be absorbed by the material. With a shift from the visible region to the near-infrared region, photon absorption efficiency of crystalline silicon declines, fabricating the insufficient photon absorption by silicon a prominent problem that requires attention from engineering technicians. Although photon absorption efficiency can be increased by using a greater silicon thickness, this will in turn bring huge challenges to the semiconductor process being used, fabricating the approach not cost effective.

In order to enhance the ability of a silicon surface in a device to capture incident light energy and thus reduce reflective loss of the light energy and improve the device's light absorption and conversion efficiency, various "finely roughened" surface structures like pyramid arrays are created on such silicon surfaces, which can cause light to be reflected more times on the silicon surfaces. As so-treated silicon surfaces are generally black, they are commonly called "black silicon".

Existing black silicon production methods are associated with a series of problems such as difficulties in further reducing their critical dimensions (CDs), significant dark current and still unsatisfactory quantum efficiency.

SUMMARY OF THE INVENTION

It is an object of the present invention to provide a semiconductor device with increased light absorption and conversion efficiency, an additionally reduced critical dimension and effectively suppressed dark current, as well as a method of fabricating such a semiconductor device.

The present invention provides a method of fabricating a semiconductor device, including:

providing a substrate, the substrate is formed with a locating notch in an edge thereof, wherein a line connecting a center of the substrate and the locating notch defines a reference direction, wherein across a surface of the substrate, regions oriented in first and second crystallographic directions belonging to different families of crystallographic directions are periodically distributed around the center, and wherein the reference direction is parallel to the first crystallographic direction or the second crystallographic direction;

forming a patterned mask layer on the substrate surface, the patterned mask layer defining a pattern distributed in parallel to the first crystallographic direction; and forming a plurality of trenches by performing a wet etching process on the surface of the substrate using the patterned mask layer as a mask, the plurality of trenches each having a cross-sectional width decreasing from the substrate surface to the inside of the substrate, when viewed normal to a cross-section perpendicular to the substrate.

Additionally, the substrate surface may be oriented in a (100) plane, wherein the first crystallographic direction belongs to the <110> family of crystallographic directions, wherein the second crystallographic direction belongs to the <100> family of crystallographic directions, and wherein the (100) plane includes mutually perpendicular crystallographic direction I and II in the <110> family of crystallographic directions.

Additionally, the patterned mask layer may include a first set of elongate pattern elements spaced apart from one another and extending in parallel to the crystallographic direction I and/or a second set of elongate pattern elements spaced apart from one another and extending in parallel to the crystallographic direction II.

Additionally, the patterned mask layer may include both the first set of elongate pattern elements and the second set of elongate pattern elements, wherein the second set of elongate pattern elements is arranged on both sides of the first set of elongate pattern elements, or the first set of elongate pattern elements is arranged on both sides of the second set of elongate pattern elements.

Additionally, the first set of elongate pattern elements and the second set of elongate pattern elements in the patterned hard mask layer may cross each other to form a lattice pattern.

Additionally, the patterned hard mask layer may include first rectangular annular pattern elements and second rectangular annular pattern elements within the respective first rectangular annular pattern elements, wherein adjacent sides of the first and second rectangular annular pattern elements are respective parallel to the crystallographic directions I and II.

Additionally, the wet etching process may employ at least one of a TMAH solution, an ammonia solution, a KOH solution and a NaOH solution.

Additionally, the trenches may be at least one of inverted quadrilateral pyramid-shaped trenches, inverted truncated quadrilateral pyramid-shaped trenches and V-shaped trenches.

Additionally, the inverted quadrilateral pyramid-shaped trenches may have side surfaces oriented in the {111} families of crystallographic planes and surface openings oriented in the (100) plane. Alternatively, the inverted truncated quadrilateral pyramid-shaped trenches may have side surfaces oriented in the {111} families of crystallographic planes and surface openings oriented in the (100) plane.

Additionally, the formation of the patterned mask layer on the substrate surface may include:

successively forming a hard mask layer and a photoresist layer over the substrate surface; exposing and developing the photoresist layer; patterning the hard mask layer by etching the hard mask layer, with the patterned photoresist layer serving as a mask.

Additionally, the method may further include:

removing the patterned hard mask layer; and forming a filler layer, which fills the trenches.

The present invention also provides a semiconductor device, including:

a substrate, the substrate being formed with a locating notch in an edge thereof, wherein a line connecting a center of the substrate and the locating notch defines a reference direction, wherein across a surface of the substrate, regions oriented in first and second crystallographic directions belonging to different families of crystallographic directions are periodically distributed around the center, and wherein the reference direction is parallel to the first crystallographic direction or the second crystallographic direction; and a plurality of trenches formed in the substrate surface, each of the trenches having a cross-sectional width decreasing from the substrate surface to the inside of the substrate, when viewed normal to a cross-section perpendicular to the substrate.

Additionally, the semiconductor device may be formed using the method as defined above.

Compared with the prior art, the present invention offers the following benefits:

In the semiconductor device and method of the present invention, the reference direction for the substrate is parallel to the first or second crystallographic direction, and the patterned hard mask layer is distributed along the first crystallographic direction. For substrates with notches oriented in different crystallographic directions, the patterned mask layer may be designed and adapted in accordance therewith and used as a mask in the wet etching process for forming the trenches in the substrate surface. When viewed normal to the cross-section perpendicular to the substrate, each trench has a cross-sectional width decreasing from the substrate surface toward the inside of the substrate. This allows the semiconductor device to have increased light absorption and conversion efficiency. The present invention enables an additional reduction in critical dimension (CD) and greater freedom of design. Forming the trenches by wet etching can avoid increased dark current due to damage to the trenches' side surfaces that may be caused by the use of a dry etching process. Thus, an effective improvement in terms of dark current can be achieved.

BRIEF DESCRIPTION OF THE DRAWINGS

FIG. 1 is a flow diagram of a method of fabricating a semiconductor device according to an embodiment of the present invention.

FIG. 2 is a schematic diagram of a structure resulting from patterning of a photoresist layer in the method according to an embodiment of the present invention.

FIG. 3 is a schematic diagram of a structure resulting from etching of a hard mask layer in the method according to an embodiment of the present invention.

4

Figure 5:
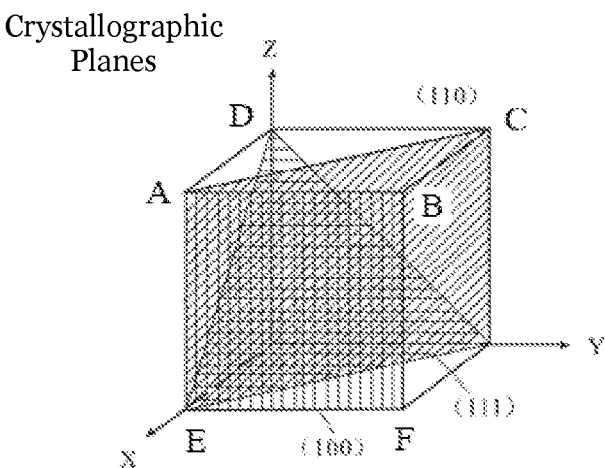

FIG. 5 is a conventional schematic diagram of crystallographic planes.

Figure 6:
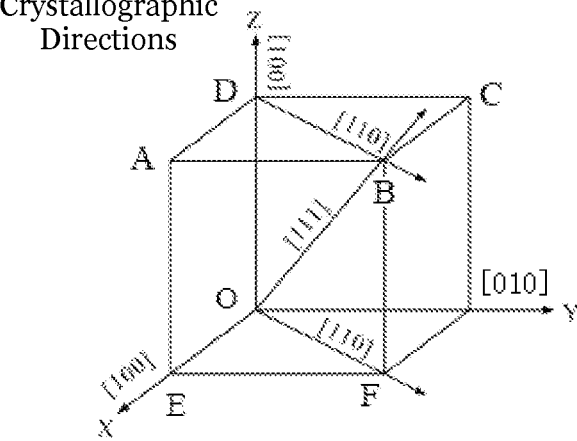

FIG. 6 is a conventional schematic diagram of crystallographic directions.

Figures 7A, 7B:
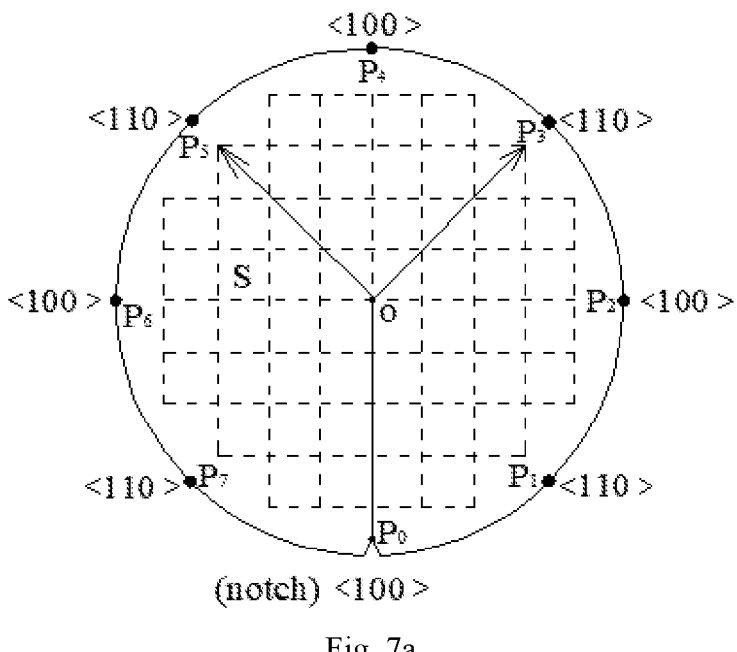

FIG. 7a is a schematic diagram showing a semiconductor device according to a first embodiment of the present invention, in which a notch in a substrate is oriented in a <100> direction.

FIGS. 7b to 7e are schematic diagrams of single dies in different examples of the first embodiment.

Figure 8A:
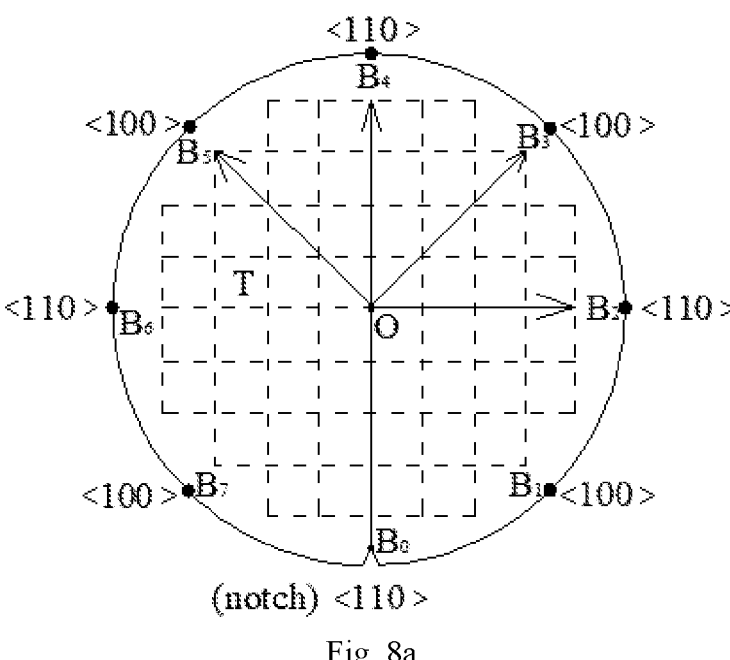

FIG. 8a is a schematic diagram showing a semiconductor device according to a second embodiment of the present invention, in which a notch in a substrate is oriented in a <110> direction.

FIGS. 8b to 8f are schematic diagrams of single dies in different examples of the second embodiment.

Figure 9:
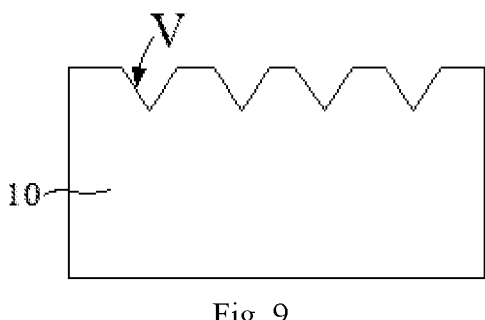

FIG. 9 is a schematic diagram of a structure resulting from removal of the hard mask layer in the method according to an embodiment of the present invention.

Figure 10:
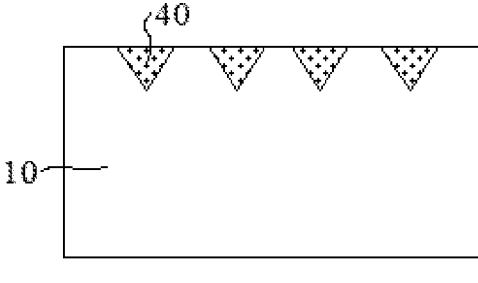

FIG. 10 is a schematic diagram of a structure resulting from formation of a filler layer in the method according to an embodiment of the present invention.

DETAILED DESCRIPTION

As discussed in the Background section, current black silicon production methods are associated with a series of problems such as difficulties in further reducing their critical dimensions (CDs), significant dark current and still unsatisfactory quantum efficiency.

Specifically, during the creation of a "finely roughened" surface structure, for example, with dense trenches (wide at the top narrow and at the bottom) on a silicon surface, photoresist is often used as a mask. Since the ability of photoresist to be patterned is limited, it does not allow a further CD reduction, leading to limitations in the freedom of design. When the trenches are formed using a dry etching process, a thicker photoresist layer is required to be used as a mask due to strong bombardment power of the dry etching process. However, the thicker photoresist layer will lead to the formation of more unwanted by-products during the dry etching process, and the dry etching process itself may cause damage to side surfaces of the trenches being fabricated in silicon. These will lead to an increase in dark current. Further, the side surfaces of the trenches formed by dry etching are usually inclined with respect to a plane parallel to the silicon surface by an angle of about 70-85°, not the expected angle for quantum efficiency maximization that is 54.7°. Therefore, further improvements in quantum efficiency are still needed.

In view of this, embodiments of the present invention provide a semiconductor device and a method of fabricating the semiconductor device. The present invention will be described in greater detail below by way of specific embodiments with reference to the accompanying drawings. Features and advantages of the invention will be more apparent from the following detailed description. Note that the figures are provided in a very simplified form not necessarily drawn to exact scale and for the only purpose of facilitating easy and clear description of the embodiments.

For ease of description, relative spatial terms such as "above", "under", "upper" and "lower" may be used in the description of some embodiments disclosed herein to describe how one element or component is related to another element or component, or to other elements or components, as in the accompanying drawings illustrating the embodiments. It is to be understood that, apart from those shown, such relative spatial terms are also intended to describe various orientations that can be assumed in use or operation of the device shown. For example, if the device is turned upside down, then an element or component described as being "under" or "below" another element or component should now be described as being "above" or "on top of" the other element or component. As used hereinafter, the terms "first", "second" and the like may be used to distinguish between similar elements without necessarily implying any particular ordinal or chronological sequence. It is to be understood that the terms so used are interchangeable, whenever appropriate.

Embodiments of the present invention provide a method of fabricating a semiconductor device. As shown in FIG. 1, the method includes the steps as detailed below.

A substrate is provided, which has a locating notch in its edge. A line connecting a center of the substrate and the locating notch defines a reference direction. Across a surface of the substrate, regions oriented in first and second crystallographic directions belonging to different families of crystallographic directions are periodically distributed around the center. The reference direction is parallel to the first or second crystallographic direction.

A patterned mask layer is formed on the substrate surface. A pattern defined by the patterned mask layer is distributed along the first crystallographic direction.

With the patterned mask layer serving as a mask, trenches are formed in the substrate surface by wet etching. In a cross-section perpendicular to the substrate, each trench has a cross-sectional width decreasing from the substrate surface toward the inside of the substrate.

The various steps in the method according to embodiments of the present invention will be described in greater detail below with reference to FIGS. 2 to 10.

Figure 4:
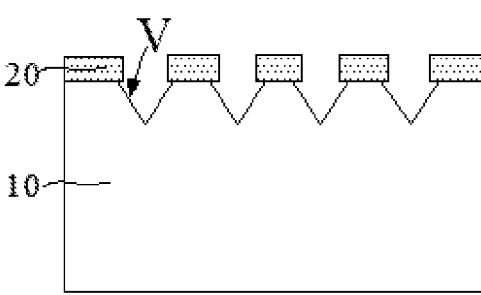
FIG. 4 is a schematic diagram of a structure resulting from formation of trenches by wet etching in the method according to an embodiment of the present invention.

As shown in FIGS. 2 and 3, a substrate 10 is provided, a hard mask layer 20 and a photoresist layer 30 are successively formed over the provided substrate 10. The semiconductor device is usually fabricated from a silicon wafer. Materials from which the substrate can be fabricated may include germanium, silicon germanium, silicon carbide, gallium arsenide, gallium arsenide or other III-V compounds. Alternatively, the substrate may be a silicon-on-insulator (SOI) substrate or the like, or implanted with ions of a dopant (e.g., n-type) for modifying its electrical parameters according to the design requirements. An epitaxial layer may be formed on the substrate. In this case, the substrate surface refers to a top surface of the epitaxial layer. The hard mask layer 20 includes, for example, at least one of a silicon nitride film, a borosilicate glass (BSG) film and a tetraethyl orthosilicate (TEOS) film. The hard mask layer 20 may be grown by a chemical vapor deposition (CVD) process. The hard mask layer 20 exhibits good step coverage and high resistance to etching by chemical solutions. The photoresist layer 30 is patterned by exposure and development, and with the patterned photoresist layer 30 serving as a mask, the hard mask layer 20 is patterned by etching. A pattern defined by the patterned hard mask layer 20 is distributed along the first crystallographic direction. As shown in FIG. 4, with the patterned hard mask layer 20 serving as a mask, a wet etching process is performed on the surface of the substrate 10, resulting in the formation of the trenches V.

FIG. 7a is a schematic diagram showing the semiconductor device according to a first embodiment of the present invention, in which the notch in the substrate is oriented in a <100> direction. FIG. 7b is a schematic diagram showing a single die in the substrate of FIG. 7a. As shown in FIGS.

7a and 7b, in a first embodiment, the substrate 10 is oriented in a (100) plane, and the reference direction defined by the line $OP_0$ connecting the center O of the substrate 10 and the locating notch in the edge of the substrate 10 is a crystallographic direction of the <100> family of crystallographic directions in the (100) plane, such as the [001] direction. Scribe lines are marked along two mutually perpendicular directions in the <100> family of crystallographic directions. Thus, the single die S is diced along the scribe lines that are parallel to the crystallographic directions in the <100> family of crystallographic directions. The first and second crystallographic directions belonging to different families of crystallographic directions, in which the regions periodically distributed around the center O are oriented are a <110> crystallographic direction and a <100> crystallographic direction, respectively. As used herein, the (100) plane represents a member of the {100} family that consists of the (100), (010) and (001) crystallographic planes. Likewise, the [110] crystallographic direction represents a member of the <110> family of crystallographic directions, and the [100] crystallographic direction represents a member of the <100> family of crystallographic directions.

At radial positions of the wafer, within the same crystallographic plane, regions oriented in the crystallographic directions respectively of the <110> and <100> families each span an angle of 90 degrees and circumferentially alternate. When the crystallographic direction of the <110> family is rotated by 45 degrees clockwise or counterclockwise, it will come into coincidence with the crystallographic direction of the <100> family.

In this embodiment, the reference direction defined by the notch is the second crystallographic direction belonging to the <100> family in the (100) plane. FIG. 5 is a conventional schematic diagram of crystallographic planes, and FIG. 6 is a conventional schematic diagram of crystallographic directions. As shown in FIGS. 5 and 6, as conventionally understood, the (100) plane (ABFE) is perpendicular to the crystallographic direction (OE), and the [100] crystallographic direction is not in the (100) plane. As used herein, by convention in the art, the (100) plane represents a member of the {100} families of crystallographic planes, for example, the (001) plane (ABCD) in which the [100] crystallographic direction (DA) in the <100> family lies in.

With continued reference to FIGS. 7a and 7b, $OP_3$ and $OP_5$ represent the mutually perpendicular crystallographic directions I and II in the <110> family of crystallographic directions in the (100) plane.

In the first embodiment, the patterned hard mask layer 20 includes a first set of elongate pattern elements 211 spaced apart from one another and all extending in parallel to the crystallographic direction I (e.g., $OP_3$) and/or a second set of elongate pattern elements 212 spaced apart from one another and all extending in parallel to the crystallographic direction II (e.g., $OP_5$). As an example, the second set of elongate pattern elements 212 is arranged in parallel to $OP_5$ on both sides of the first set of elongate pattern elements 211. Alternatively, the second set of elongate pattern elements is arranged in parallel to $OP_5$ in a mutually spaced manner, and the first set of elongate pattern elements is arranged in parallel to $OP_3$ also in a mutually spaced manner on both sides of the second set of elongate pattern elements. When the wet etching process is performed on the surface of the substrate 10 with the patterned hard mask layer 20 of this embodiment serving as a mask, the formed trenches V are in the shape of inverted triangles, each having a cross-sectional width decreasing from the substrate surface toward the inside of the substrate, when viewed normal to the cross-section perpendicular to the substrate. In this way, according to Snell's law, light normal to the substrate will be incident on side surfaces of the trenches, refracted into the substrate and totally reflected within the substrate. As a result, the light travels a longer path within the wafer, and the extended effective optical path length in the substrate results in increased light absorption efficiency. As the light is reflected within the substrate a greater number of times, the substrate surface is more powerful in capturing energy of the incident light, resulting in reduced reflective loss of the light energy and thus enhanced light absorption and conversion efficiency of the device.

In a second embodiment, the patterned hard mask layer (not shown) includes elongate pattern elements spaced apart from one another and all extending in parallel to $OP_3$ or $OP_5$. In this embodiment, across the whole surface of the substrate 10, discrete V-shaped trenches extending in parallel to one crystallographic direction in the <110> family are formed, which can also result in enhanced light absorption and conversion efficiency of the device.

Figure 7C:
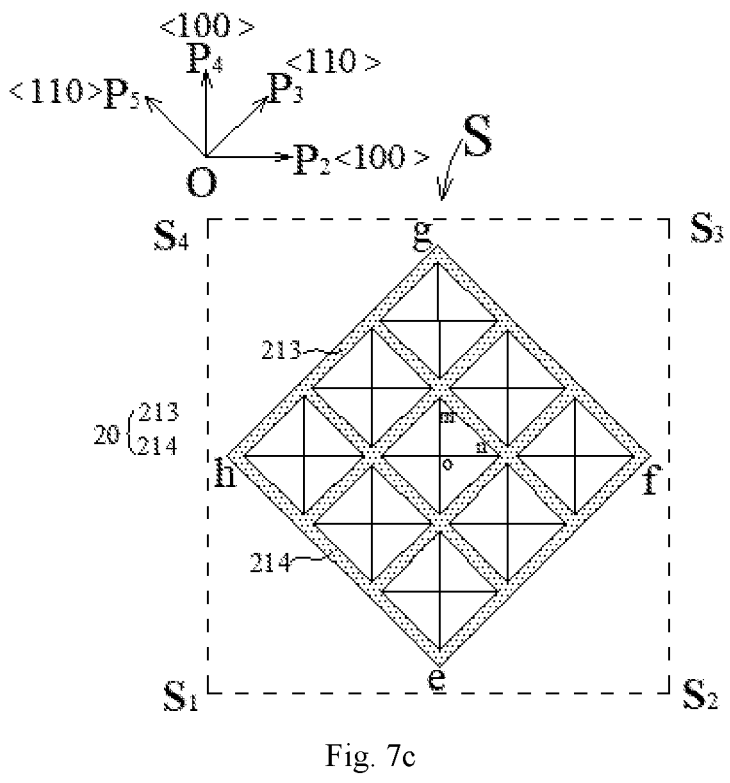

With continued reference to FIGS. 7a and 7c, in a third embodiment, the patterned hard mask layer 20 defines a lattice pattern consisting of parallel linear pattern elements 213 extending in the crystallographic direction I (e.g., $OP_3$) and parallel linear pattern elements 214 extending in the crystallographic direction II (e.g., $OP_5$), which cross each other. When the wet etching process is performed on the surface of the substrate 10 with the patterned hard mask layer 20 of this embodiment serving as a mask, the formed trenches V are dense and define a finely roughened surface structure. Such trench isolation structures are also called cell deep trench isolation (CDTI) structures. When viewed normal to the cross-section perpendicular to the substrate, each trench has a cross-sectional width decreasing from the substrate surface toward the inside of the substrate. When viewed normal to the cross-section perpendicular to the substrate, each trench has an inverted trapezoidal or inverted triangular cross-sectional shape. As an example, when viewed from the top, the trenches appear like inverted quadrilateral pyramids (inverted pyramids) or inverted truncated quadrilateral pyramids. In case of the inverted quadrilateral pyramids, their side surfaces are oriented along the {111} family of crystallographic planes, and their surface openings are oriented along the (100) plane. In case of the inverted truncated quadrilateral pyramids, their side surfaces are oriented along the {111} family of crystallographic planes, and their surface openings are oriented along the (100) plane. When viewed from the top, the trenches appear like an array of inverted quadrilateral pyramids (inverted pyramid) or an array of inverted truncated quadrilateral pyramids. The CDTI trench array formed in this embodiment allows light to be reflected within the substrate a greater number of times, fabricating the substrate surface more powerful in capturing energy of the incident light and thus resulting in reduced reflective loss of light energy and enhanced light absorption and conversion efficiency of the device.

Figure 7D:
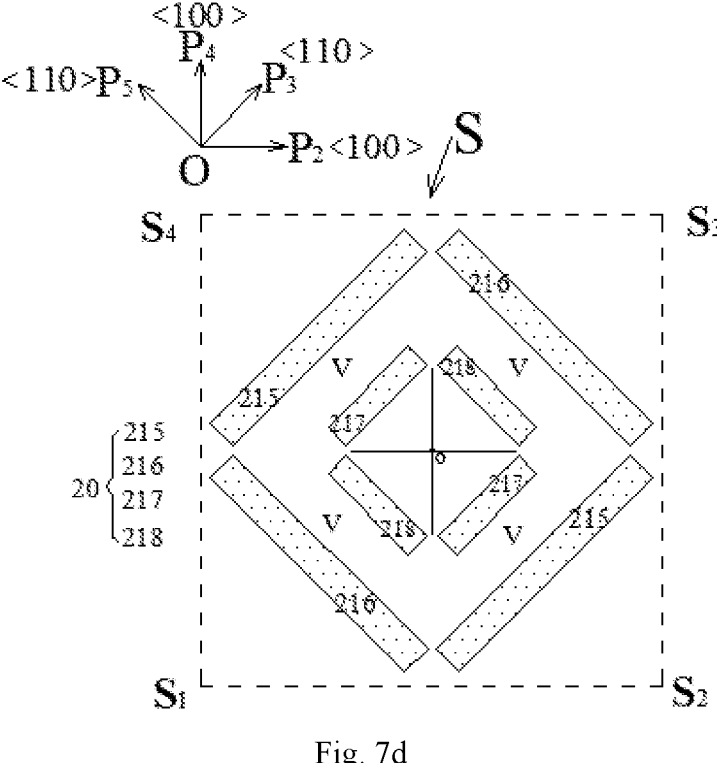
Figure 7E:
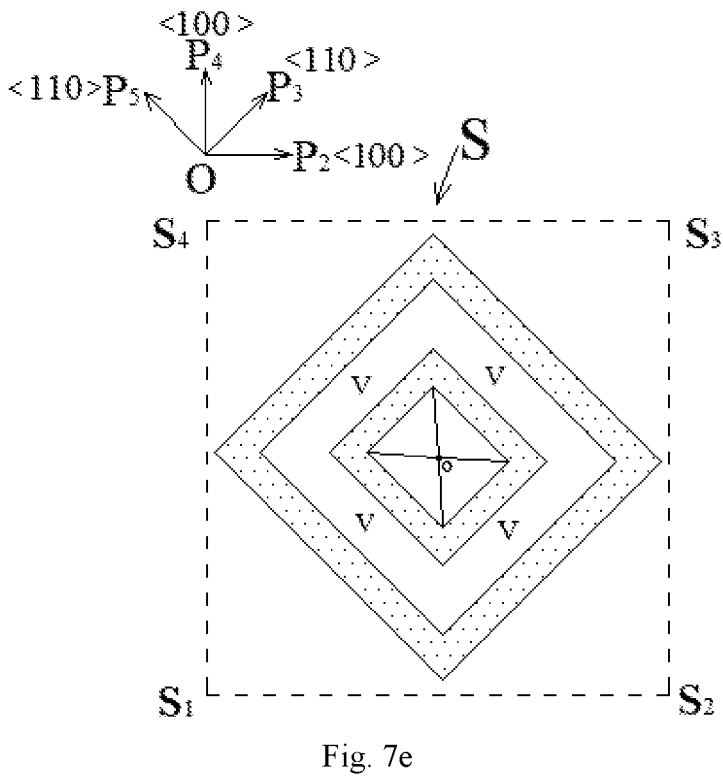

With continued reference to FIGS. 7a and 7d (a fourth embodiment) and FIG. 7e (a fifth embodiment), in the fourth and fifth embodiments, the patterned hard mask layer 20 includes first rectangular annular pattern elements and second rectangular annular pattern elements within the respective first rectangular annular pattern elements. Adjacent sides of the first and second rectangular annular pattern elements are oriented in mutually perpendicular crystallographic directions in the <110> family. Specifically, for example, adjacent sides of the first rectangular annular pattern elements (e.g., 215 and 216) may be respectively parallel to the crystallographic direction I (e.g., $OP_3$) and the crystallographic direction II (e.g., $OP_5$). Adjacent sides of the second rectangular annular pattern elements (e.g., 217 and 218) may also be respectively parallel to the crystallographic direction I (e.g., $OP_3$) and the crystallographic direction II (e.g., $OP_5$). In the fourth embodiment, the four sides of each of the first and second rectangular annular pattern elements may be disconnected at the corners of the rectangle (as shown in FIG. 7d). In the fifth embodiment, the four sides of each of the first and second rectangular annular pattern elements may be interconnected (as shown in FIG. 7e). When the wet etching process is performed on the surface of the substrate 10 with the patterned hard mask layer 20 of any of these embodiments serving as a mask, the trenches formed in the second rectangular annular pattern elements appear, when viewed from the top, as inverted quadrilateral pyramids (inverted pyramids) or inverted truncated quadrilateral pyramids. Moreover, V-shaped trenches parallel to the sides of the rectangles are formed between the first rectangular annular pattern elements and the second rectangular annular pattern elements. For example, V-shaped trenches extending in parallel to the crystallographic direction I (e.g., $OP_3$) are formed between the sides 215 of the first rectangular annular pattern elements and the sides 217 of the second rectangular annular pattern elements, and V-shaped trenches extending in parallel to the crystallographic direction II (e.g., $OP_5$) are formed between the sides 216 of the first rectangular annular pattern elements and the sides 218 of the second rectangular annular pattern elements. The trenches formed in these embodiments include the V-shaped ones and the inverted quadrilateral pyramid-or inverted truncated quadrilateral pyramid-shaped ones. The trenches formed in these embodiments allow light to be reflected within the substrate a greater number of times, fabricating the substrate surface more powerful in capturing energy of the incident light and thus resulting in reduced reflective loss of light energy and enhanced light absorption and conversion efficiency of the device.

FIGS. 7a to 7e show various examples of the first embodiment of the present invention. In the first embodiment, the reference direction (defined by the notch) is parallel to one crystallographic direction in the <100> family, and the scribe lines may be marked along two mutually perpendicular crystallographic directions in the <100> family. That is, the sides of each single die may be oriented in two mutually perpendicular crystallographic directions in the <100> family. In this embodiment, for any single die, the elongate pattern elements in the patterned hard mask layer may be inclined by 45° with respect to the scribe lines.

Figure 8B:
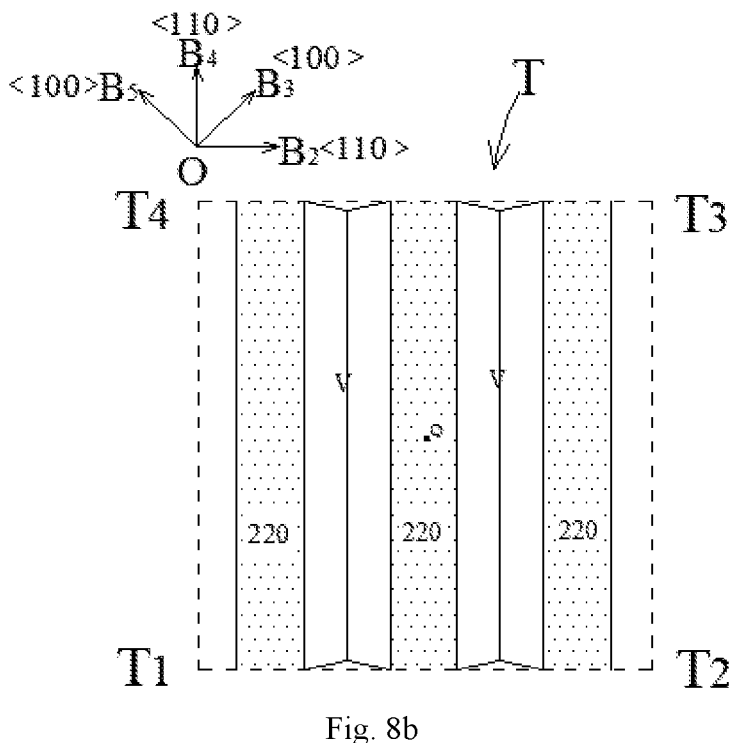

FIG. 8a is a schematic diagram showing the semiconductor device according to a second embodiment of the present invention, in which the notch in the substrate is oriented in a crystallographic direction of the <110> family. FIG. 8b is a schematic diagram showing a single die in the substrate of FIG. 8a. As shown in FIG. 8a, the substrate 10 is oriented in a (100) plane, and scribe lines for individual dies may be oriented along two mutually perpendicular crystallographic directions in the <110> family. Thus, the single die T is diced along the scribe lines that are parallel to the crystallographic directions in the <100> family of crystallographic directions. The reference direction defined by the line $OB_0$ connecting the center O of the substrate 10 and the locating notch in the edge of the substrate 10 is a crystallographic direction of the <100> family. The first and second crystallographic directions belonging to different families of crystallographic directions, in which the regions periodically distributed around the center O are oriented are a <110> crystallographic direction and a <100> crystallographic direction, respectively.

At radial positions of the wafer, within the same crystallographic plane, regions oriented in the crystallographic directions respectively of the <110> and <100> families each span an angle of 90 degrees and circumferentially alternate. When the crystallographic direction of the <110> family is rotated by 45 degrees clockwise or counterclockwise, it will come into coincidence with the crystallographic direction of the <100> family.

$OB_2$ and $OB_4$ represent the mutually perpendicular crystallographic directions I and II in the <110> family of crystallographic directions in the (100) plane.

As shown in FIGS. 8a and 8b, in a first embodiment, the patterned hard mask layer includes elongate pattern elements 220 spaced apart from one another and all extending in parallel to the crystallographic direction I (e.g., $OB_4$) or the crystallographic direction II (e.g., $OB_2$). In this embodiment, across the entire surface of the substrate 10, V-shaped trenches are formed, which are spaced apart from one another and extend in parallel to one crystallographic direction of the <110> family. These trenches can result in increased light absorption and conversion efficiency of the device.

Figure 8C:
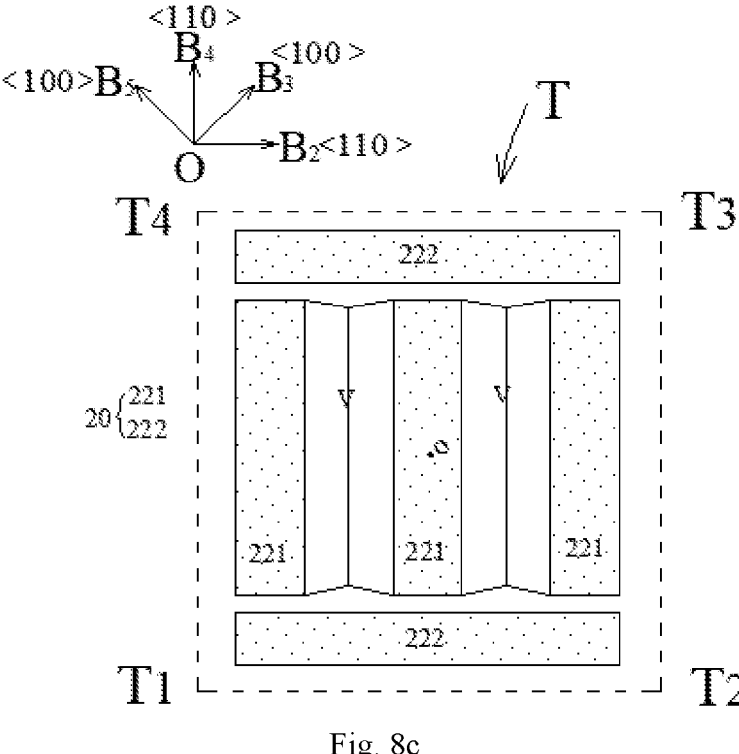

As shown in FIGS. 8a and 8c, in a second embodiment, the patterned hard mask layer 20 includes a first set of elongate pattern elements 221 spaced apart from one another and extending in parallel to the crystallographic direction I (e.g., $OB_4$) and elongate pattern elements 222 arranged on both sides of the first set of elongate pattern elements 221 and extending in parallel to the crystallographic direction II (e.g., $OB_2$). Alternatively, it includes a second set of elongate pattern elements 221 spaced apart from one another and extending in parallel to the crystallographic direction II and elongate pattern elements arranged on both sides of the second set of elongate pattern elements and extending in parallel to the crystallographic direction I. When the wet etching process is performed on the surface of the substrate 10 with the patterned hard mask layer 20 of this embodiment serving a mask, the formed trenches V extend in the crystallographic direction I (e.g., $OB_4$) and, when viewed normal to a cross-section along the crystallographic direction II (e.g., $OB_2$) and perpendicular to the substrate, are in the shape of inverted triangles, each having a cross-sectional width decreasing from the substrate surface toward the inside of the substrate. This results increases light absorption efficiency by allowing light to be reflected a greater number of times. Therefore, the substrate surface is more powerful in capturing energy of incident light, resulting in reduced reflective loss of light energy and hence enhanced light absorption and conversion efficiency of the device.

Figure 8D:
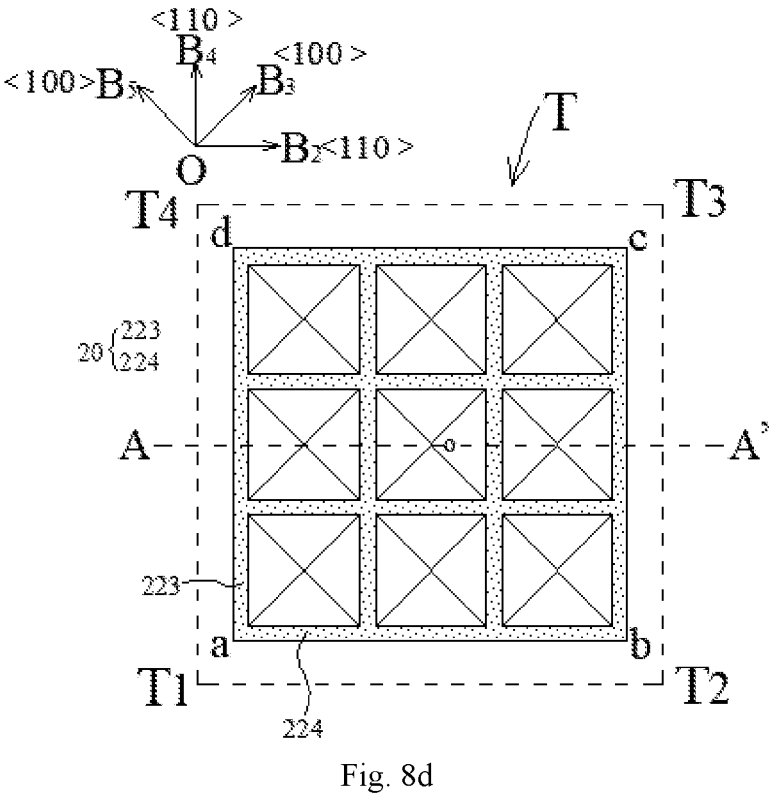

As shown in FIGS. 8a and 8d, in a third embodiment, the patterned hard mask layer 20 defines a lattice pattern consisting of parallel linear pattern elements 223 extending in the crystallographic direction I (e.g., $OB_4$) and parallel linear pattern elements 224 extending in the crystallographic direction II (e.g., $OB_2$), which cross each other. When the wet etching process is performed on the surface of the substrate 10 with the patterned hard mask layer 20 of this embodiment serving as a mask, the formed trenches V are dense and define a finely roughened surface structure. Such trench isolation structures are also called cell deep trench isolation (CDTI) structures. When viewed normal to the cross-section perpendicular to the substrate, each trench has a cross-sectional width decreasing from the substrate surface toward the inside of the substrate. When viewed normal to the cross-section perpendicular to the substrate, each trench has an inverted trapezoidal or inverted triangular cross-sectional shape. As an example, when viewed from the top, the trenches appear like inverted quadrilateral pyramids (inverted pyramids) or inverted truncated quadrilateral pyramids. In case of the inverted quadrilateral pyramids, their side surfaces are oriented along the {111} family of crystallographic planes, and their surface openings are oriented along the (100) plane. In case of the inverted truncated quadrilateral pyramids, their side surfaces are oriented along the {111} family of crystallographic planes, and their surface openings are oriented along the (100) plane. When viewed from the top, the trenches appear like an array of inverted quadrilateral pyramids (inverted pyramid) or an array of inverted truncated quadrilateral pyramids.

The CDTI trench array formed in this embodiment allows light to be reflected within the substrate a greater number of times, fabricating the substrate surface more powerful in capturing energy of the incident light and thus resulting in reduced reflective loss of light energy and hence enhanced light absorption and conversion efficiency of the device.

Figure 8E:
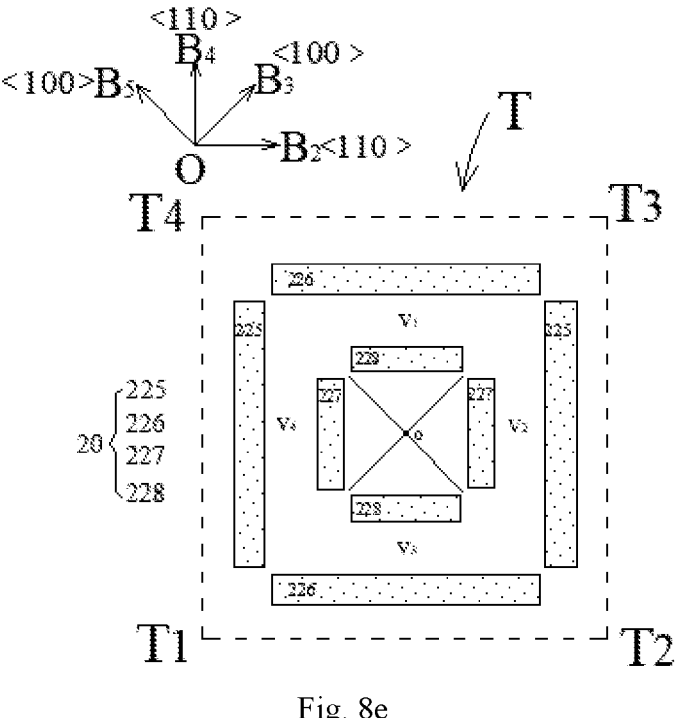
Figure 8F:
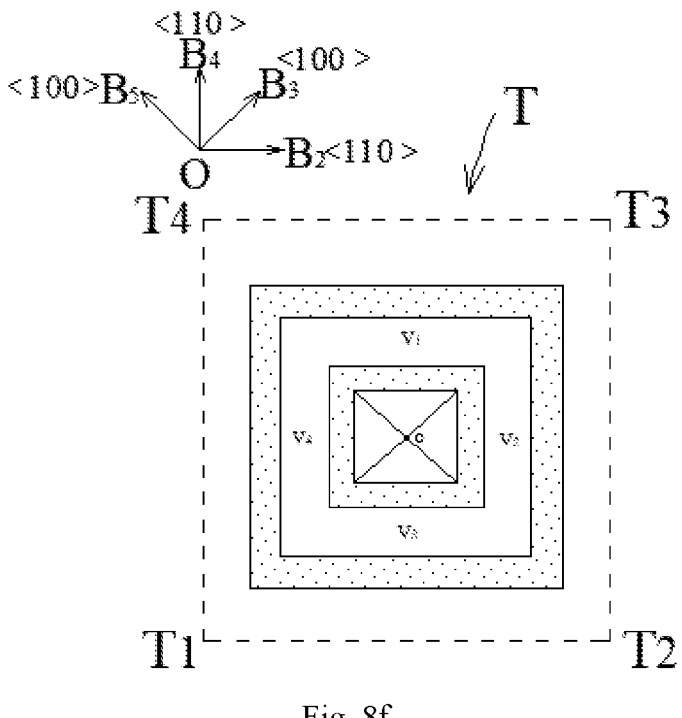

As shown in FIGS. 8a and 8e (a fourth embodiment) and FIG. 8f (a fifth embodiment), in the fourth and fifth embodiments, the patterned hard mask layer 20 includes first rectangular annular pattern elements and second rectangular annular pattern elements within the respective first rectangular annular pattern elements. Adjacent sides of the first and second rectangular annular pattern elements are respectively parallel to the crystallographic direction I (e.g., $OB_4$) and the crystallographic direction II (e.g., $OB_2$). Specifically, for example, adjacent sides of the first rectangular annular pattern elements (e.g., 225 and 226) may be respectively parallel to the crystallographic direction I (e.g., $OB_4$) and the crystallographic direction II (e.g., $OB_2$). Adjacent sides of the second rectangular annular pattern elements (e.g., 227 and 228) may also be respectively parallel to the crystallographic direction I (e.g., $OB_4$) and the crystallographic direction II (e.g., $OB_2$). In the fourth embodiment, the four sides of each of the first and second rectangular annular pattern elements may be disconnected at the corners of the rectangle (as shown in FIG. 8e). In the fifth embodiment, the four sides of each of the first and second rectangular annular pattern elements may be interconnected (as shown in FIG. 8f). When the wet etching process is performed on the surface of the substrate 10 with the patterned hard mask layer 20 of any of these embodiments serving as a mask, the trenches formed in the second rectangular annular pattern elements appear, when viewed from the top, as inverted quadrilateral pyramids (inverted pyramids) or inverted truncated quadrilateral pyramids. Moreover, V-shaped trenches parallel to the sides of the rectangles are formed between the first rectangular annular pattern elements and the second rectangular annular pattern elements. For example, V-shaped trenches extending in parallel to the crystallographic direction I (e.g., $OB_4$) are formed between the sides 225 of the first rectangular annular pattern elements and the sides 227 of the second rectangular annular pattern elements, and V-shaped trenches extending in parallel to the crystallographic direction II (e.g., $OB_2$) are formed between the sides 226 of the first rectangular annular pattern elements and the sides 228 of the second rectangular annular pattern elements. The trenches formed in these embodiments include the V-shaped ones and the inverted quadrilateral pyramid-or inverted truncated quadrilateral pyramid-shaped ones. The trenches formed in these embodiments allow light to be reflected within the substrate a greater number of times, fabricating the substrate surface more powerful in capturing energy of the incident light and thus resulting in reduced reflective loss of light energy and hence enhanced light absorption and conversion efficiency of the device.

FIGS. 8a to 8e show various examples of the second embodiment of the present invention. In the second embodiment, the reference direction (defined by the notch) is parallel to one crystallographic direction in the <110> family, and the scribe lines for individual dies may be marked along two mutually perpendicular crystallographic directions in the <110> family. That is, the sides of each single die may be oriented in two mutually perpendicular crystallographic directions in the <110> family. In this embodiment, for any single die, the elongate pattern elements in the patterned hard mask layer may be perpendicular to the scribe lines.

In the first and second embodiments of the present invention, the substrate is oriented in the (100) crystallographic plane, and the patterned hard mask layer is oriented in the first crystallographic direction. Using the patterned hard mask layer according to any of the foregoing examples as a mask, the trenches are formed in the substrate surface by wet etching. In one embodiment, a tetramethyl ammonium hydroxide (TMAH) solution with a concentration of 20-25% by weight may be used to perform wet etching for 1-12 min to form inverted triangular or inverted trapezoidal trenches. These inverted triangular trenches are densely distributed across the substrate surface to form a "finely roughened" surface structure. Such CDTI structures are uniform in shape and provide good process controllability. In another embodiment, CDTI trenches may be formed by placing the wafer in an alkaline solution at a temperature of 40-88° C. for 300-2500 seconds for wet etching. The alkaline solution may include at least one of a TMAH solution, an ammonia solution, a potassium hydroxide (KOH) solution and a sodium hydroxide (NaOH) solution. The alkaline solution may be a mixture of TMAH and an ammonia solution. The alkaline solution may further include 1-3% by weight of an aqueous NaOH or KOH solution. The anisotropic nature of the reaction between the alkaline solution and the wafer can modify and reconstruct the nano-sized finely roughened surface structure into a submicron-sized pyramid-shaped surface structure. During the anisotropic wet etching process on the substrate surface, silicon atoms on different crystallographic planes are etched in different rates because of their different atomic densities and activation energies, and those on the {111} families of crystallographic planes are etched most slowly. As a result, the etching process terminates at four crystallographic planes of the {111} family intersecting the (100) plane of silicon, resulting in the formation of a number of inverted (quadrilateral) pyramids having four side surfaces oriented in the four crystallographic planes of the {111} family and a top opening oriented in the (100) plane in the silicon surface. These structures have strong diffractive and anti-reflective effects, which allow light to travel a longer path within the wafer, and the extended effective optical path length in the wafer results in increased light absorption efficiency.

According to the present invention, the reference direction for the substrate is parallel to the first or second crystallographic direction, and the patterned hard mask layer is distributed along the first crystallographic direction. For substrates with notches oriented in different crystallographic directions, the patterned mask layer may be designed and adapted in accordance therewith and used as a mask in the wet etching process for forming the trenches in the substrate surface. The present invention enables a reduction in critical dimension (CD) and greater freedom of design. Forming the trenches by wet etching can avoid increased dark current due to damage to the trenches' side surfaces that may be caused by the use of a dry etching process. Thus, an effective improvement in terms of dark current can be achieved.

Further, the trenches assume the shape of inverted quadrilateral pyramids (inverted pyramids) or inverted truncated quadrilateral pyramids, which have side surfaces oriented along the {111} families of crystallographic planes and top openings oriented along the (100) plane. The side surfaces of the trench inverted quadrilateral pyramids or of the inverted truncated quadrilateral pyramids form an angle of 54.7° with the (100) plane in which the substrate is oriented. Their cross-sectional inverted triangles or inverted trapezoids are wide at the top and narrow at the bottom. With said angle, light normal to the substrate will be incident on side surfaces of the trenches, refracted into the substrate and totally reflected within the substrate. As a result, the light travels a longer path within the wafer, and the extended effective optical path length in the substrate results in increased light absorption efficiency. Thus, a significant improvement in quantum efficiency can be obtained. Accordingly, image sensors or range sensors fabricated from the semiconductor device also have improved quantum efficiency.

As shown in FIG. 9, the patterned hard mask layer is removed, for example, using HF acid.

As shown in FIG. 10, a filler layer 40 is formed. Specifically, the filler layer 40 may be formed using a chemical vapor deposition process. The filler layer 40 is, for example, a silicon oxide layer. The filler layer may be deposited so as to fill up the trenches and cover the substrate surface. Subsequently, a chemical mechanical polishing (CMP) process may be employed to remove the oxide layer above the substrate surface, or when desired, thin it to a predetermined thickness. The filler layer 40 is made of a light-transmitting material, which does not affect any optical path while flattening the finely roughened substrate surface through filling the trenches to facilitate the subsequent formation of films or layers over the substrate. Moreover, it can protect the surfaces of the trenches in the silicon-based substrate against damage, moisture, dust or other adverse effects.

Embodiments of the present invention also provide a semiconductor device, which includes:

a substrate with a locating notch in its edge, wherein a line connecting a center of the substrate and the locating notch defines a reference direction, wherein across a surface of the substrate, regions oriented in first and second crystallographic directions belonging to different families of crystallographic directions are periodically distributed around the center, and wherein the reference direction is parallel to the first or second crystallographic direction; and a plurality of trenches formed in the substrate surface, each of the trenches having a cross-sectional width decreasing from the substrate surface to the inside of the substrate, when viewed normal to a cross-section perpendicular to the substrate.

Specifically, the substrate surface is oriented in a (100) plane, and the first crystallographic direction belongs to the <110> family of crystallographic directions and the second crystallographic direction to the <100> family of crystallographic directions. The trenches are at least one of inverted quadrilateral pyramid-shaped trenches, inverted truncated quadrilateral pyramid-shaped trenches and V-shaped trenches. The trenches are filled with a filler layer. The semiconductor device is formed by the method as described above.

In summary, in the semiconductor device and method of the present invention, the reference direction for the substrate is parallel to the first or second crystallographic direction, and the patterned hard mask layer is distributed along the first crystallographic direction. For substrates with notches oriented in different crystallographic directions, the patterned mask layer may be designed and adapted in accordance therewith and used as a mask in the wet etching process for forming the trenches in the substrate surface. When viewed normal to the cross-section perpendicular to the substrate, each trench has a cross-sectional width decreasing from the substrate surface toward the inside of the substrate. This allows the semiconductor device to have increased light absorption and conversion efficiency. The present invention enables an additional reduction in critical dimension (CD) and greater freedom of design. Forming the trenches by wet etching can avoid increased dark current due to damage to the trenches' side surfaces that may be caused by the use of a dry etching process. Thus, an effective improvement in terms of dark current can be achieved.

The embodiments disclosed herein are described in a progressive manner, with the description of each embodiment focusing on its differences from others. Reference can be made between the embodiments for their identical or similar parts. Since the method embodiments correspond to the device embodiments, they are described relatively briefly, and reference can be made to the device embodiments for details of them.

The foregoing description is merely that of several preferred embodiments of the present invention and is not intended to limit the scope of the claims of the invention in any way. Any person of skill in the art may make various possible variations and changes to the disclosed embodiments in light of the methodologies and teachings disclosed hereinabove, without departing from the spirit and scope of the invention. Accordingly, any and all such simple variations, equivalent alternatives and modifications made to the foregoing embodiments based on the essence of the present invention without departing from the scope of the embodiments are intended to fall within the scope of protection of the invention.

What is claimed is:

1. A method of fabricating a semiconductor device, comprising:

providing a substrate, the substrate being formed with a locating notch in an edge thereof, wherein a line connecting a center of the substrate and the locating notch defines a reference direction, wherein across a surface of the substrate, regions oriented in first and second crystallographic directions belonging to different families of crystallographic directions are periodically distributed around the center, and wherein the reference direction is parallel to the first crystallographic direction or the second crystallographic direction;

forming a patterned mask layer on the surface of the substrate, the patterned mask layer defining a pattern distributed in parallel to the first crystallographic direction; and forming a plurality of trenches by performing a wet etching process on the surface of the substrate using the patterned mask layer as a mask, the plurality of trenches each having a cross-sectional width decreasing from the surface of the substrate to the inside of the substrate, when viewed normal to a cross-section perpendicular to the substrate, and the plurality of trenches forming a finely roughened surface structure for extending an optical path length in an optoelectronic device, wherein the patterned mask layer comprises a first set of elongate pattern elements and a second set of elongate pattern elements, and wherein the second set of elongate pattern elements is arranged on both sides of the first set of elongate pattern elements, or the first set of elongate pattern elements is arranged on both sides of the second set of elongate pattern elements, wherein the wet etching process employs at least one of a tetramethyl ammonium hydroxide (TMAH) solution, an ammonia solution, a potassium hydroxide (KOH) solution and a sodium hydroxide (NaOH) solution, and wherein the plurality of trenches are at least one of inverted quadrilateral pyramid-shaped trenches and inverted truncated quadrilateral pyramid-shaped trenches.

2. The method of claim 1, wherein the surface of the substrate is oriented in a (100) plane, wherein the first crystallographic direction belongs to the <110> family of crystallographic directions, wherein the second crystallographic direction belongs to the <100> family of crystallographic directions, and wherein the (100) plane includes mutually perpendicular crystallographic direction I and II in the <110> family of crystallographic directions.

3. The method of claim 2, wherein the patterned mask layer comprises a first set of elongate pattern elements spaced apart from one another and extending in parallel to the crystallographic direction I and/or a second set of elongate pattern elements spaced apart from one another and extending in parallel to the crystallographic direction II.

4. The method of claim 2, wherein the patterned hard mask layer comprises first rectangular annular pattern elements and second rectangular annular pattern elements within the respective first rectangular annular pattern elements, and wherein adjacent sides of the first and second rectangular annular pattern elements are respective parallel to the crystallographic directions I and II.

5. The method of claim 1, wherein the first set of elongate pattern elements and the second set of elongate pattern elements in the patterned hard mask layer cross each other to form a lattice pattern.

6. The method of claim 1, wherein the inverted quadrilateral pyramid-shaped trenches have side surfaces oriented in the {111} families of crystallographic planes and surface openings oriented in the (100) plane, or wherein the inverted truncated quadrilateral pyramid-shaped trenches have side surfaces oriented in the {111} families of crystallographic planes and surface openings oriented in the (100) plane.

7. The method of claim 1, wherein the formation of the patterned mask layer on the surface of the substrate comprises:

successively forming a hard mask layer and a photoresist layer over the surface of the substrate; exposing and developing the photoresist layer; patterning the hard mask layer by etching the hard mask layer, with the patterned photoresist layer serving as a mask.

8. The method of claim 7, further comprising:

removing the patterned hard mask layer; and forming a filler layer, which fills the plurality of trenches.

9. The method of claim 1, wherein when viewed normal to the cross-section perpendicular to the substrate, each trench has an inverted trapezoidal or inverted triangular cross-sectional shape.

* * * * *